(12) United States Patent
Chatterjee

(10) Patent No.: US 11,606,109 B2
(45) Date of Patent: Mar. 14, 2023

(54) DYNAMICALLY CONFIGURABLE TRANSMITTER POWER LEVELS

(71) Applicant: TEXAS INSTRUMENTS INCORPORATED, Dallas, TX (US)

(72) Inventor: Rohit Chatterjee, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 49 days.

(21) Appl. No.: 17/385,653

(22) Filed: Jul. 26, 2021

(65) Prior Publication Data

US 2022/0345161 A1  Oct. 27, 2022

(51) Int. Cl.
*H04B 1/04* (2006.01)
*H03F 3/24* (2006.01)
*H03F 3/72* (2006.01)
*H01L 23/66* (2006.01)

(52) U.S. Cl.
CPC ........... *H04B 1/0458* (2013.01); *H01L 23/66* (2013.01); *H03F 3/245* (2013.01); *H03F 3/72* (2013.01); *H01L 2223/6611* (2013.01); *H01L 2223/6655* (2013.01); *H03F 2200/537* (2013.01)

(58) Field of Classification Search
CPC ..... H01L 2223/6611; H01L 2223/6655; H01L 23/66; H03F 2200/537; H03F 3/245; H03F 3/72; H04B 1/0458
See application file for complete search history.

(56) References Cited

U.S. PATENT DOCUMENTS

| 10,581,478 | B1* | 3/2020 | Tam | H04B 1/0458 |
| 2014/0347124 | A1* | 11/2014 | Joshi | H03F 3/24 |
| | | | | 330/51 |
| 2015/0050901 | A1* | 2/2015 | Lee | H04B 1/0483 |
| | | | | 455/127.3 |
| 2022/0060155 | A1* | 2/2022 | Kuo | H03F 3/245 |

* cited by examiner

*Primary Examiner* — Nguyen T Vo
(74) *Attorney, Agent, or Firm* — Krista Y. Chan; Frank D. Cimino

(57) ABSTRACT

In many examples, a device comprises a transmitter. The transmitter comprises a power amplifier, a first transformer coil coupled to the power amplifier, and a second transformer coil adapted to be electromagnetically coupled to the first transformer coil. The transmitter also comprises a first bond wire coupled to a first end of the second transformer coil and adapted to be coupled to a first end of an antenna, a capacitor coupled to a second end of the second transformer coil, a switch coupled to the capacitor and configured to engage and disengage the capacitor from the transmitter, and a second bond wire coupled to the switch and adapted to be coupled to a second end of the antenna.

21 Claims, 5 Drawing Sheets

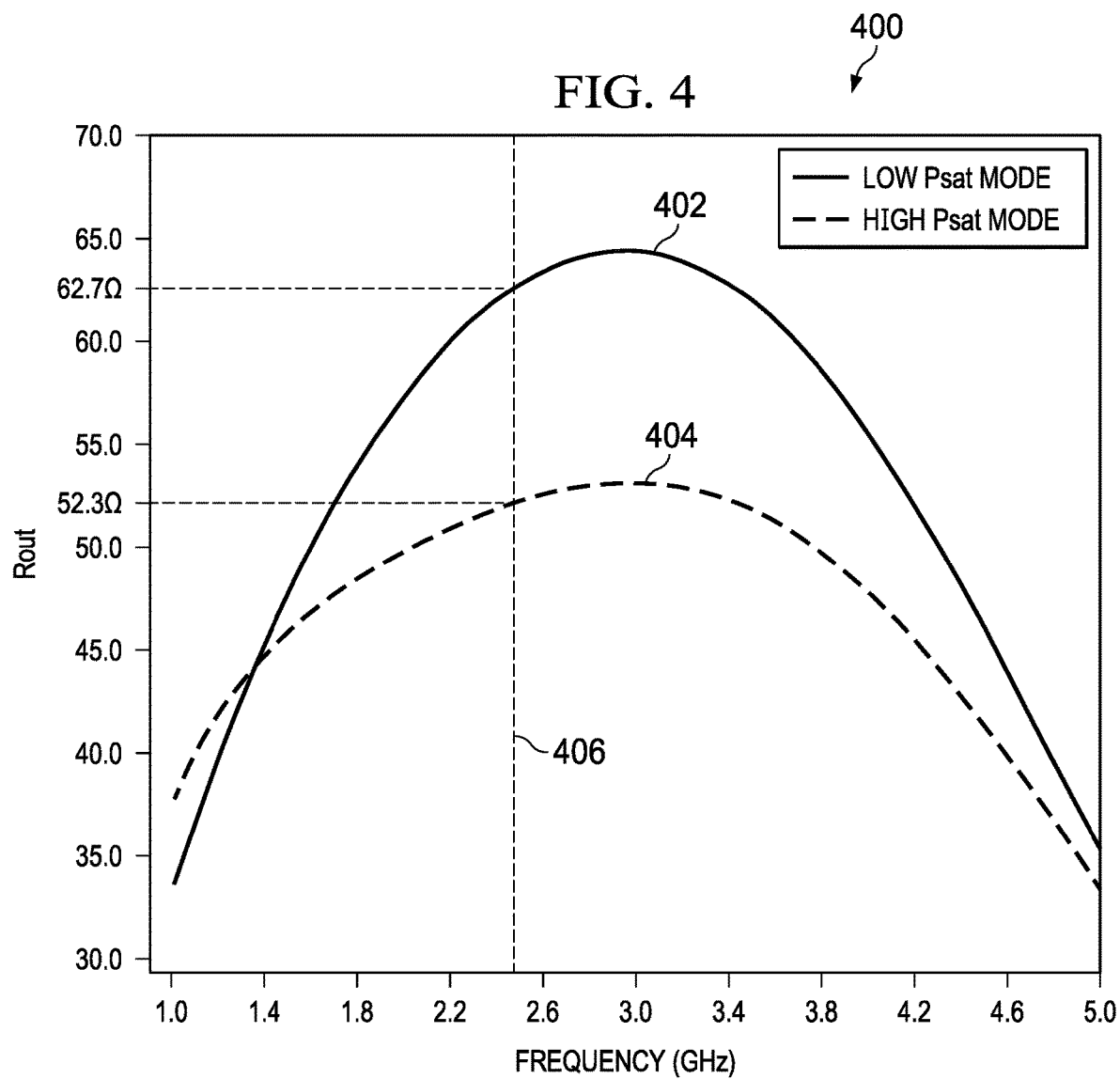

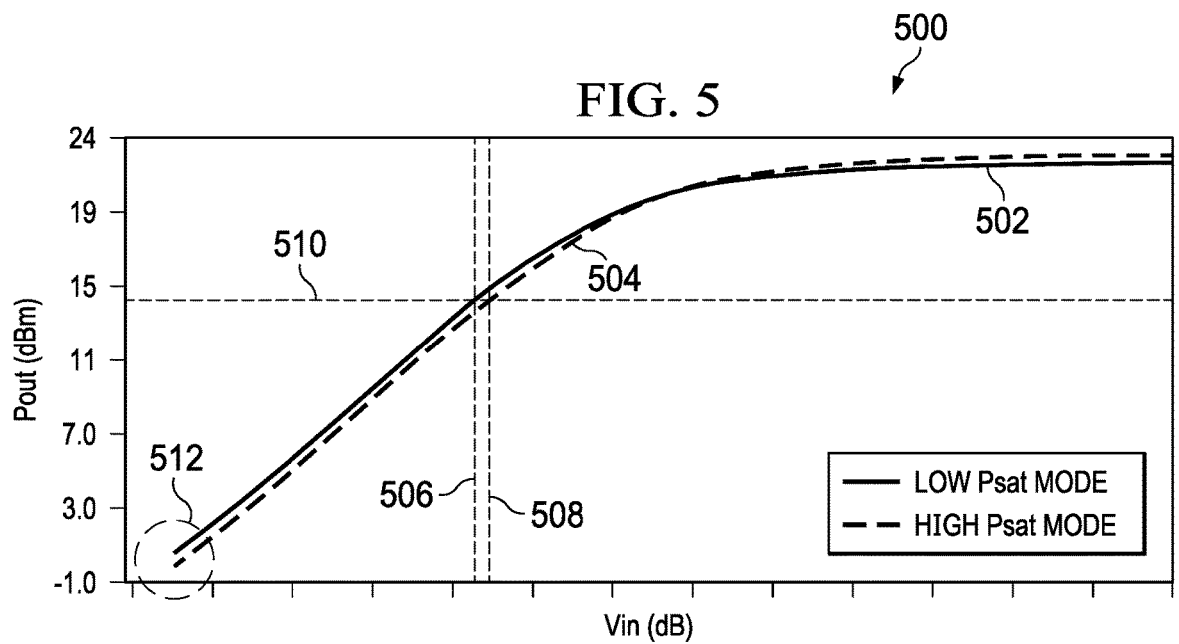
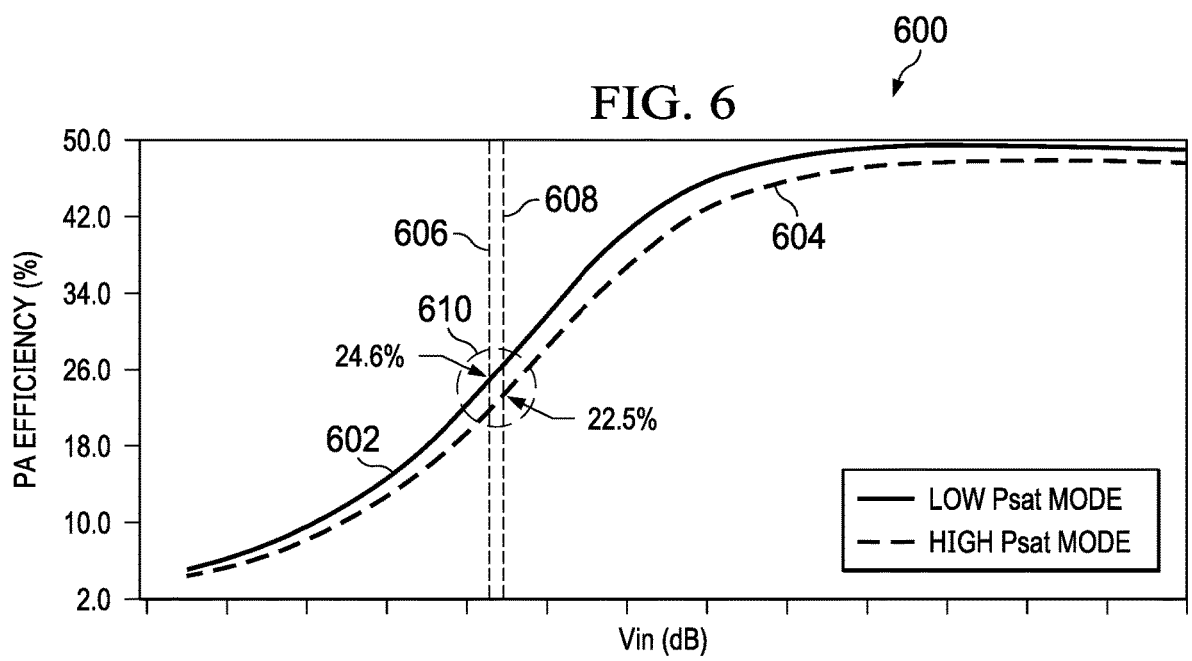

DYNAMICALLY CONFIGURABLE TRANSMITTER POWER LEVELS

CROSS-REFERENCE TO RELATED APPLICATIONS

The present application claims priority to India Provisional Patent Application No. 202141018631, which was filed Apr. 22, 2021, is titled "Reconfigurable PA Output Matching Network To Improve Transmit Efficiency," and is hereby incorporated herein by reference in its entirety.

BACKGROUND

Wireless local area network (WLAN) integrated circuits (ICs) may include transmitters and receivers. The transmitter in a WLAN IC may include a power amplifier. The transmitter may use the power amplifier to transmit data packets at various power levels, depending on the target range of the transmitter. Higher power levels may be used to transmit data packets over greater distances, and, conversely, lower power levels may be used to transmit data packets over lesser distances.

The WLAN IC may be positioned within a semiconductor package that includes bond wires to couple the WLAN IC to semiconductor package terminals (e.g., leads). The semiconductor package may be coupled to a printed circuit board (PCB) using the terminals. Traces on the PCB may couple the semiconductor package terminals to an antenna on the PCB.

SUMMARY

In many examples, a device comprises a transmitter. The transmitter comprises a power amplifier, a first transformer coil coupled to the power amplifier, and a second transformer coil adapted to be electromagnetically coupled to the first transformer coil. The transmitter also comprises a first bond wire coupled to a first end of the second transformer coil and adapted to be coupled to a first end of an antenna, a capacitor coupled to a second end of the second transformer coil, a switch coupled to the capacitor and configured to engage and disengage the capacitor from the transmitter, and a second bond wire coupled to the switch and adapted to be coupled to a second end of the antenna.

In many examples, a device includes a transmitter, comprising a power amplifier, a first transformer coil coupled to the power amplifier, and a second transformer coil adapted to be electromagnetically coupled to the first transformer coil. The transmitter comprises a first bond wire coupled to a first end of the second transformer coil and adapted to be coupled to a first end of an antenna. The transmitter also includes a first leg including a capacitor coupled to a second end of the second transformer coil, a first switch coupled in series with the capacitor, and a second bond wire coupled in series to the first switch, the second bond wire adapted to be coupled to a second end of the antenna. The transmitter also includes a second leg coupled in parallel with the first leg, the second leg including a second switch coupled to the second end of the second transformer coil and to the capacitor and a third bond wire coupled in series to the second switch, the third bond wire adapted to be coupled to the second end of the antenna.

In many examples, a device comprises a transmitter, including a power amplifier, a first transformer coil coupled to the power amplifier, and a second transformer coil adapted to be electromagnetically coupled to the first transformer coil. The transmitter includes a capacitor coupled to the second transformer coil, a first transistor coupled in series with the capacitor, and a first bond wire coupled to the first transistor. The transmitter includes a second transistor coupled to the second transformer coil and the capacitor and a second bond wire coupled to the second transistor. The device includes a controller coupled to the transmitter. The controller is configured to turn on the first transistor and turn off the second transistor to enact a first power mode in which the capacitor is engaged with the second bond wire, and wherein, in the first power mode, the transmitter is configured to transmit signals at a first maximum power level that is based on a capacitance of the capacitor. The controller is configured to turn off the first transistor and turn on the second transistor to enact a second power mode in which the capacitor is disengaged from the second bond wire, and wherein, in the second power mode, the transmitter is configured to transmit signals at a second maximum power level that is less than the first maximum power level.

BRIEF DESCRIPTION OF THE DRAWINGS

FIG. 4 is a graph depicting transmitter impedance as a function of frequency, in accordance with various examples.

FIG. 5 is a graph depicting transmitter output power as a function of transmitter input power, in accordance with various examples.

FIG. 6 is a graph depicting transmitter power amplifier efficiency as a function of transmitter input power, in accordance with various examples.

DETAILED DESCRIPTION

Figure 1A:
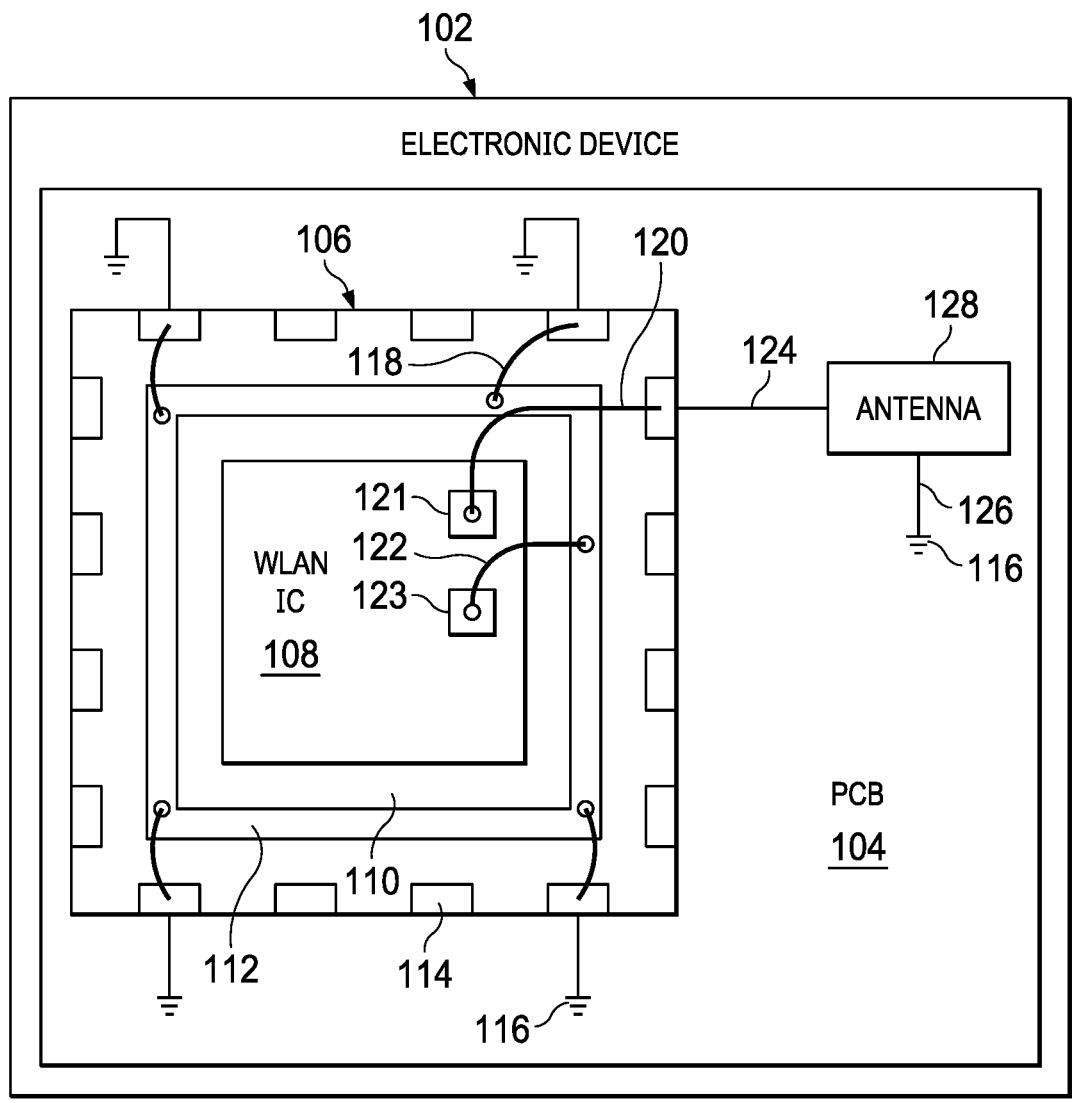
FIG. 1A is a top-down schematic diagram of an electronic device having dynamically configurable transmitter power levels, in accordance with various examples.

As described above, a power amplifier in a WLAN IC transmitter may transmit data packets at varying power levels. For example, the power amplifier may transmit some packets at an average power level Pavg, but the power amplifier may be able to transmit other packets at a maximum, or saturated, power level Psat. The difference between Psat and Pavg is called a backoff. In many applications, the larger the backoff, the greater the operational inefficiency of the power amplifier, because while the power amplifier transmits a majority of data packets at or near a Pavg power level, the power amplifier still must support the Psat power level. In some cases, a WLAN IC transmitter is designed to transmit over significant distances, and in such cases, the transmitter may shift from a low power mode to a high power mode that has an increased Pavg and an increased Psat. In such cases, the total backoff of the transmitter when shifting from a high power mode to a low power mode is greater than it would have otherwise been in a single-mode transmitter, because the difference between the Psat in the high power mode and the Pavg in the low power mode is increased. This increased backoff exacerbates the inefficiency described above, thereby negatively affecting battery life.

In many examples, the semiconductor package covering the WLAN IC presents further inefficiencies. Specifically, the WLAN IC transmitter includes a transformer that is coupled to the power amplifier. The transformer is coupled to terminals of the semiconductor package by way of bond wires within the package. The terminals of the semiconductor package, in turn, are coupled to an antenna on the PCB by way of metal traces on the PCB. The bond wires include parasitic inductances that present inefficiencies. The parasitic inductance of the bond wire means that a greater voltage must be provided by the transformer to achieve a particular target output voltage at the antenna. To achieve this greater voltage at the transformer output, a greater voltage must be provided at the transformer input. The relatively increased voltages at the transformer output and input result in greater transformer losses (e.g., balun losses), and, thus, in greater inefficiencies and excessive battery usage. Stated another way, balun losses increase with increasing bond wire parasitic inductances. In high-frequency applications (e.g., in the 5.9-7.1 GHz range), these losses and inefficiencies become more pronounced.

This disclosure describes various examples of a WLAN IC transmitter that mitigates the challenges described above by providing the ability to dynamically switch between low and high power modes. In the low power mode, the WLAN IC dynamically reduces its Psat by adjusting a switch to short out a capacitor in the WLAN IC. In the high power mode, the WLAN IC increases its Psat by adjusting the switch to engage the capacitor in the WLAN IC. Enablement of the low power mode when transmitting over smaller distances dynamically reduces the Psat of the transmitter so that it is not unnecessarily high, and enablement of the high power mode restores a higher Psat to facilitate transmission over larger distances. Dynamically reducing the Psat when high Psat levels are not needed mitigates transmitter inefficiencies. Further, the engagement of the capacitor in the high power mode reduces bond wire parasitic inductance to mitigate transformer losses.

More specifically, in some examples, the WLAN IC transmitter includes a capacitor coupled in series with a bond wire that couples the WLAN IC to a package terminal. The capacitor is switchably coupled to the bond wire, meaning that a switch (e.g., a transistor) is coupled in parallel with the capacitor and, depending on whether the switch is opened or closed, the capacitor is engaged or is disengaged (e.g., shorted). When the WLAN IC transmitter is in the low power mode, it closes the switch to short the capacitor, thus resulting in a relatively higher impedance seen by the power amplifier and thus resulting in a lower Psat value. In the low power mode, higher Psat values are unnecessary, and setting Psat to a lower value in this manner results in a lower backoff and thus an improved efficiency and battery life. Conversely, when the WLAN IC transmitter is in the high power mode, the switch opens and the capacitor is engaged, thus resulting in a relatively lower impedance seen by the power amplifier and a higher Psat value. When engaged in the WLAN IC, the capacitor reduces the effective inductance of the bond wire to which the capacitor is coupled, thereby mitigating the transformer losses and inefficiencies described above.

FIG. 1A is a top-down schematic diagram of an electronic device 102 having dynamically configurable transmitter power levels, in accordance with various examples. The electronic device 102 may include a personal electronic device (e.g., smartphones, laptop computers, desktop computers, tablets, notebooks, artificial intelligence assistants), an electronic appliance (e.g., refrigerators, microwave ovens, toaster ovens, dishwashers), a networking or enterprise-level electronic device or system (e.g., servers, routers, modems, mainframe computers, wireless access points), an automobile or aviation device or system (e.g., control panels, entertainment devices, navigation devices, power electronics), or any of a variety of other electronic devices or systems. The electronic device 102 may include a printed circuit board (PCB) 104. Various components may be coupled to (e.g., mounted on) the PCB 104. For example, a semiconductor package 106 and an antenna 128 may be coupled to the PCB 104. The semiconductor package (or, more simply, the package) 106 may include a wireless local area network (WLAN) integrated circuit (IC) 108. The constituent components of the WLAN IC 108 are described herein as being formed in a single semiconductor die, but the scope of this disclosure includes packages 106 that include multiple ICs that communicate with each other using wire bonds or other suitable connectors.

The WLAN IC 108 is coupled to a die pad 110, which, in turn, is circumscribed by a ground plane 112. The package 106 includes metal contacts 114 that are exposed to an exterior of the package 106. Bond wires 118 couple the ground plane 112 to some of the metal contacts 114, which, in turn, are coupled to ground 116 (e.g., by way of metal traces on the PCB). A bond wire 120 couples a bond pad 121 on the device side of the WLAN IC 108 to a metal contact 114, and a bond wire 122 couples a bond pad 123 on the device side of the WLAN IC 108 to the ground plane 112. A metal trace 124 on the PCB 104 couples the metal contact 114 to which the bond wire 120 is coupled to the antenna 128, and a metal trace 126 couples the antenna 128 to ground 116. As mentioned above and as described in greater detail below, the bond wires 120, 122 provide parasitic inductances that introduce power-related inefficiencies to the WLAN IC 108. Further, but for the dynamic adjustment of Psat levels described herein, the WLAN IC 108 would have an undesirably high back-off (BO) from the Psat to Pave that also contributes to these power-related inefficiencies. As described below, the WLAN IC 108 is configured to dynamically adjust transmitter power levels by controlling a switch that engages and disengages a capacitor in the WLAN IC 108. Controlling the switch to engage and disengage the capacitor in the WLAN IC 108 can mitigate the undesirably high BO described above, thus improving power-related efficiency and preserving battery life. Further, when the capacitor is engaged, the bond wire parasitic inductance is reduced, thereby mitigating the balun losses and inefficiencies described above.

Figure 1B:
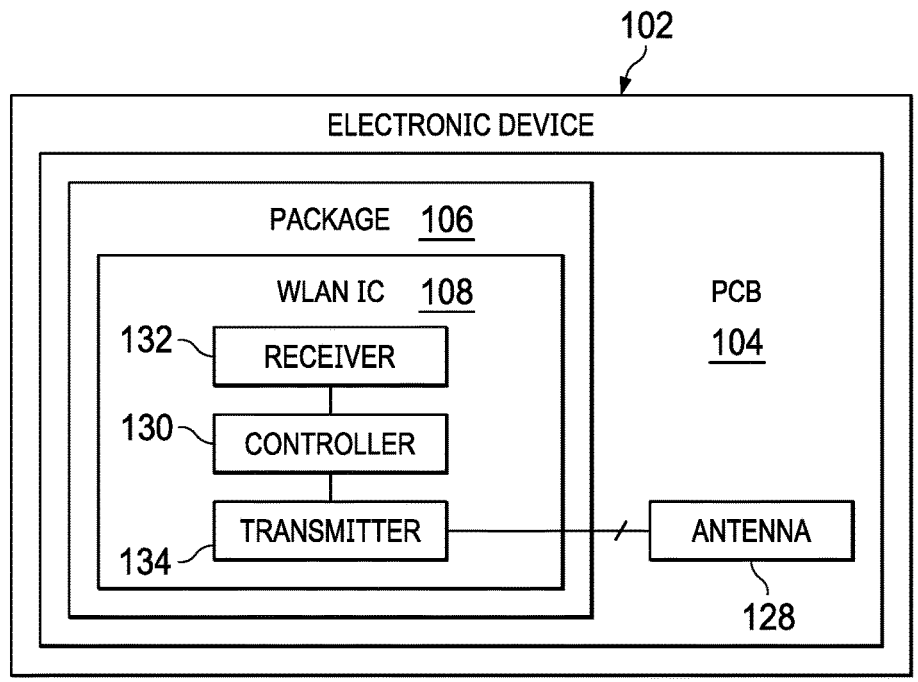
FIG. 1B is a block diagram of an electronic device having dynamically configurable transmitter power levels, in accordance with various examples.

FIG. 1B is a block diagram of the electronic device 102, in accordance with various examples. The example electronic device 102 includes the PCB 104, which includes the package 106, which includes the WLAN IC 108. The WLAN IC 108, in turn, includes a controller 130, a receiver 132, and a transmitter 134. FIG. 1B depicts the controller 130, the receiver 132, and the transmitter 134 as being part of the WLAN IC 108, but in other examples, the controller 130, the receiver 132, and/or the transmitter 134 are positioned in separate ICs or in separate packages. The antenna 128 is depicted as being coupled to the transmitter 134, but the antenna 128 may also be coupled to the receiver 132. The transmitter 134 includes the switchable capacitor described above, and in some examples, the controller 130 controls the switch, thereby enabling the controller 130 to engage and disengage the capacitor from the remainder of the circuitry within the transmitter 134. The controller 130 may control the switch to enable a low power mode (e.g., capacitor disengaged) or a high power mode (e.g., capacitor engaged) responsive to a user input, input from another electronic device or component, execution of computer-readable code (e.g., firmware and/or software stored in memory that is not expressly shown), or any other suitable input. In examples, the controller 130 may enable the low power mode to transmit signals in relatively proximal ranges, and the controller 130 may enable the high power mode to transmit signals in relatively distal ranges. To enable the low power mode, the controller 130 controls the switch to disengage the capacitor, thus enabling a lower Psat for the transmitter 134, and to enable the high power mode, the controller 130 controls the switch to engage the capacitor, thus enabling a higher Psat for the transmitter 134 and enabling the transmitter 134 to transmit to farther distances relative to distances achievable in the low power mode. However, the higher Psat is not useful when transmitting over smaller distances and thus represents a higher BO and increased inefficiency. In such cases, the controller 130 is configured to enable the low power mode, which reduces the Psat and, consequently, reduces the BO, thereby improving efficiency and conserving battery life. Furthermore, when the capacitor is engaged, the bond wire parasitic inductance is reduced, thereby mitigating the balun losses and inefficiencies described above.

Figure 1C:
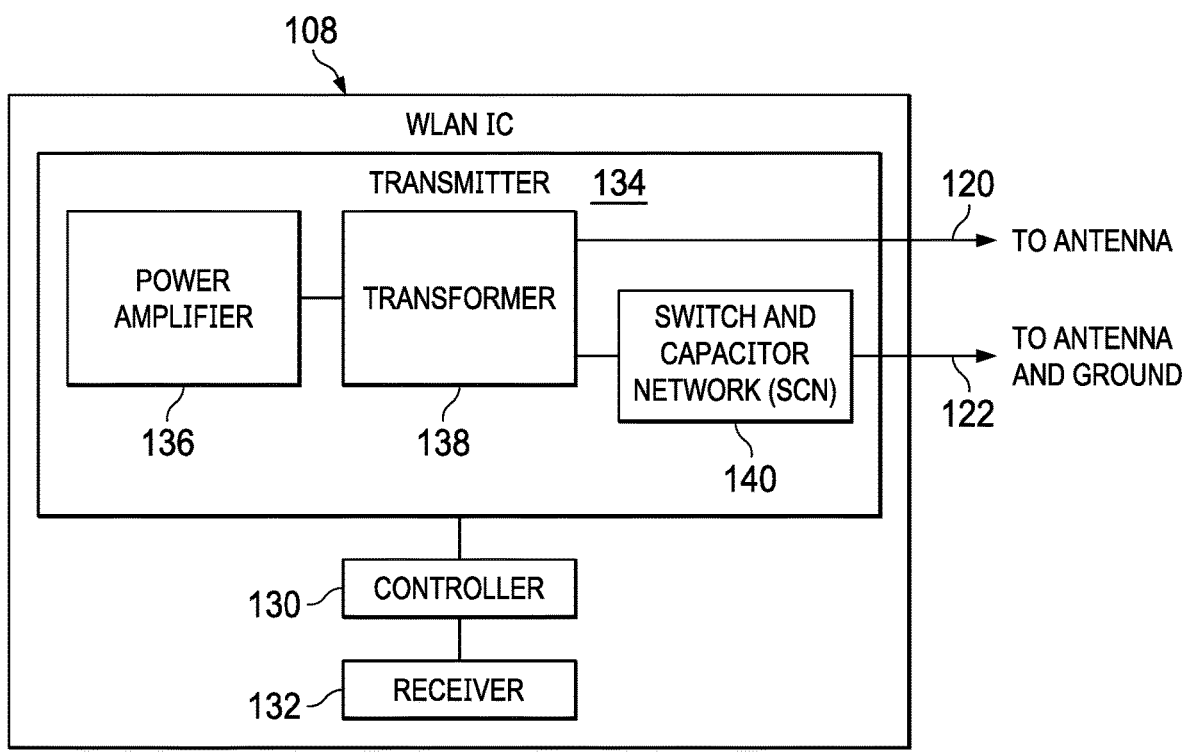
FIG. 1C is a block diagram of an integrated circuit having dynamically configurable transmitter power levels, in accordance with various examples.

FIG. 1C is a block diagram of the WLAN IC 108, in accordance with various examples. The WLAN IC 108 may include the controller 130, the receiver 132, and the transmitter 134. The controller 130 is coupled to the receiver 132 and controls the receiver 132, and the controller 130 is also coupled to the transmitter 134 and controls the transmitter 134 as described herein. The transmitter 134 may include a power amplifier (PA) 136, a transformer 138 that is coupled to the PA 136, and a switch and capacitor network (SCN) 140 that is coupled to the transformer 138. The bond wire 120 is coupled to the transformer 138 by way of the bond pad 121 (FIG. 1A), and the bond wire 122 is coupled to the SCN 140 by way of the bond pad 123 (FIG. 1A). The bond wire 120 is coupled to the antenna 128 by way of metal trace 124 (FIG. 1A), and the bond wire 122 is coupled to the antenna 128 and to ground 116 by way of the ground plane 112, bond wires 118, and metal trace 126 (FIG. 1A). Other configurations are contemplated and included in the scope of this disclosure. Although the transmitter 134 is shown to be coupled to an antenna (e.g., antenna 128), the receiver 132 also may be coupled to an antenna (e.g., antenna 128).

Still referring to FIG. 1C, in an example operation, the PA 136 amplifies a modulated data signal (e.g., received from the controller 130 or from other suitable signal processing circuitry in the transmitter 134). The transformer 138 may step up the voltage of the amplified signal according to a turns ratio of the transformer 138. The controller 130 may operate the SCN 140 to engage or disengage a capacitor in the SCN 140 using a switch in the SCN 140. Engaging and disengaging the capacitor in the SCN 140 affects the Psat levels of the transmitter 134 as described above. Specifically, disengaging the capacitor in the SCN 140 increases the total impedance of the bond wires 120, 122 seen by the PA 136, and because the overall impedance seen by the PA 136 (e.g., including the total impedance of the bond wires 120, 122 and the antenna 128) has an inverse relationship with the Psat of the transmitter 134, increasing the overall impedance decreases Psat. Thus, disengaging the capacitor in the SCN 140 reduces Psat, which is appropriate for a low power mode. Conversely, engaging the capacitor in the SCN 140 decreases the overall impedance of the bond wires 120, 122 seen by the PA 136, and because this overall impedance has an inverse relationship with the Psat of the transmitter 134, decreasing the overall impedance increases Psat. Thus, engaging the capacitor in the SCN 140 increases Psat, which is appropriate for a high power mode. Enabling the low power mode with its lower Psat when transmitting signals over relatively small distances decreases the overall BO, which improves transmitter efficiency and preserves battery life. Further, enabling the high power mode engages the capacitor and facilitates the reduction of parasitic inductance in the bond wire 122, thereby mitigating the transformer losses described above and improving efficiency and battery life even in the high power mode.

Figure 2:
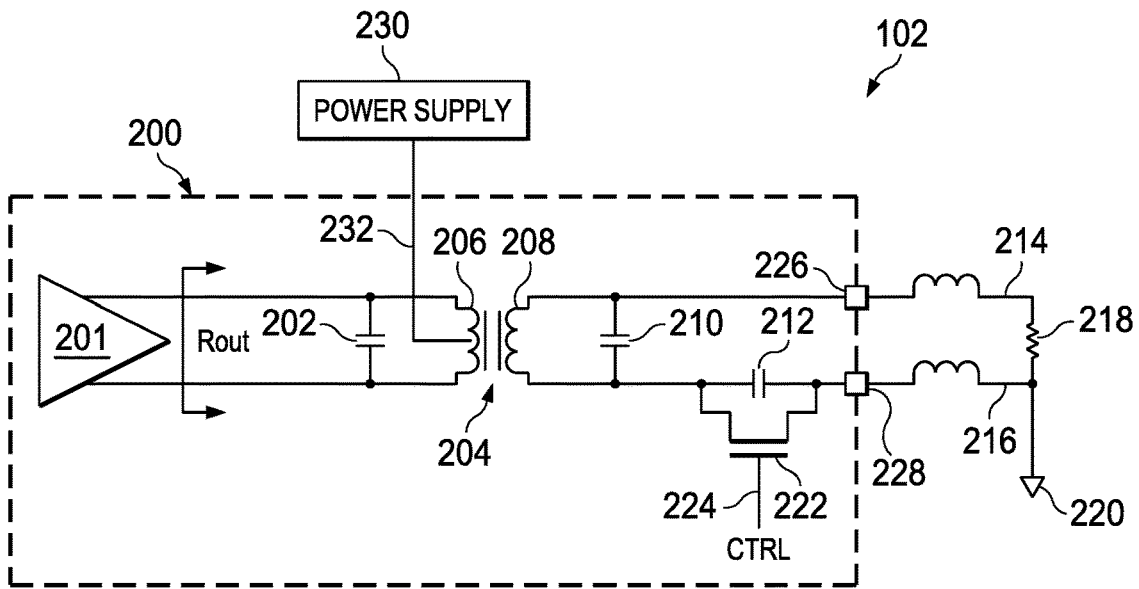
FIG. 2 is a circuit diagram of an electronic device having dynamically configurable power levels, in accordance with various examples.

FIG. 2 is a circuit diagram of the electronic device 102, in accordance with various examples. The electronic device 102 may include an example transmitter 200. The example transmitter 200 is representative of the transmitter 134 shown in FIGS. 1B and 1C. The example transmitter 200 includes a PA 201 coupled to a capacitor 202 (e.g., useful to remove the imaginary part of the overall impedance seen by the PA 201, which increases the PA efficiency) and to a transformer coil 206 of a transformer 204. The transformer coil 206 is coupled to a power supply 230 (e.g., a direct current (DC)-DC power supply) by way of a connection 232, and this power supply 230 powers the PA 201 by biasing the center tap of the transformer coil 206. A transformer coil 208 of the transformer 204 is electromagnetically coupled to the transformer coil 206. A capacitor 210 (e.g., useful to control the balun loss of the transformer 204) is coupled to the transformer coil 208. A capacitor 212 is coupled to the transformer coil 208 and to the capacitor 210. A switch 222 (e.g., a metal oxide semiconductor field effect transistor (MOSFET), such as a p-type or n-type MOSFET) is coupled in parallel with the capacitor 212. The switch 222 is controlled by a control line 224 according to a signal CTRL that may be provided by the controller 130. For example, in the instance that the switch 222 is a MOSFET, the control line 224 may be coupled to a gate terminal of the MOSFET. Together, the capacitor 212 and the switch 222 form an example SCN 140 (FIG. 1C).

FIG. 2 depicts bond pads 226 and 228, which may be examples of the bond pads 121 and 123, respectively, shown in FIG. 1A. A bond wire 214 is coupled to the bond pad 226 and is an example of the bond wire 120 of FIG. 1A. A bond wire 216 is coupled to the bond pad 228 and is an example of the bond wire 122 of FIG. 1A. As shown, the bond wires 214 and 216 include parasitic inductances, but these inductances are not labeled with numerals because they are not physical instances of inductors. A load 218 represents the antenna 128 of FIG. 1A, and the load 218 and the bond wire 216 are coupled to ground 220, which is an example of ground 116 in FIG. 1A.

In an example operation, the controller 130 (FIG. 1B) is configured to enable a low power mode and a high power mode to realize the power-related efficiency improvements described above. To enable the low power mode, the controller 130 asserts CTRL, thus turning on the switch 222 and shorting the capacitor 212. The values of the various components in the electronic device 102, such as the impedance of the load 218, the power provided by the power supply 230, and the turns ratio of the transformer 204, may be selected to achieve a particular target Psat value (e.g., approximately 22.2 dBm) when the capacitor 212 is shorted (e.g., disengaged). Psat is determined according to the expression $$Psat = \frac{2VDD^2}{Rout} - balun \text{ loss} \quad (1)$$

where VDD is the voltage provided by the power supply (e.g., power supply 230) and Rout is the impedance of the transmitter 200 seen by the PA 201 (the term Rout may be used in lieu of Zout because, as described above, the imaginary component of the overall impedance seen by the PA 201 is removed by the capacitor 202). Rout is determined according to the expression $$Rout = n^2 Rant \left[ 1 + \left\{ \frac{\omega(L1+L2) - \frac{1}{\omega C}}{Rant} \right\}^2 \right] \quad (2)$$

where Rant is the impedance of the antenna (e.g., antenna/load 218, 318), n is the transformer (e.g., transformer 204 in FIG. 2) turns ratio, ω is the angular frequency of the signal, L1+L2 is the combination of the inductances of the bond wires (e.g., bond wires 214, 216) in FIG. 2, or L1+L2+L3 representing the sum of the inductances of the bond wires (e.g., bond wires 314, 316, 336 in FIG. 3), and C is the capacitance of the capacitor 212 or 312. The transformer 204 turns ratio impacts the value of Rout as shown in expression (2). Thus, to achieve an example Psat value of approximately 22.2 dBm in the low power mode, the inductances of the bond wires 214, 216 may be 1.2 nanohenrys (nH) and 0.6 nH, respectively; the impedance of the load 218 may be 50 ohms; and the turns ratio of the transformer 204 may be 1:1.

To enable the high power mode, the controller 130 deasserts CTRL, causing the capacitor 212 to be engaged with the transmitter 200. The presence of the capacitor 212 attenuates the parasitic inductance of the bond wire 216 according to the expression $$L' = (L1 + L2)\left(1 - \frac{1}{\omega(L1+L2)\omega C}\right) \quad (3)$$

where L' is the attenuated parasitic inductance of the bond wire 216. According to expression (2) above, the reduction of the parasitic inductance of the bond wire 216 reduces Rout, and according to expression (1) above, the reduction of Rout increases Psat. The values of the various components in the transmitter 200, such as the inductances of the bond wires 214, 216, the impedance of the load 218, the turns ratio of the transformer 204, and the capacitance of the capacitor 212 may be selected to achieve a particular target Psat value (e.g., approximately 23.0 dBm) when the capacitor 212 is engaged. To achieve an example Psat value of approximately 23.0 dBm in the high power mode, the inductances of the bond wires 214, 216 may be 1.2 nH and 0.6 nH, respectively; the impedance of the load 218 may be 50 ohms; the turns ratio of the transformer 204 may be 1:1; and the capacitance of the capacitor 212 may be 4-6 pF (e.g., 5 pF). The controller 130 may enable the high power mode when the transmitter 200 is transmitting signals over relatively large distances, but the Psat associated with the high power mode is unnecessary when transmitting signals over lesser distances. Thus, when the transmitter 200 is transmitting signals over relatively smaller distances, the controller 130 may enable the low power mode, thereby decreasing Psat and reducing the BO relative to the BO that would otherwise be present if the transmitter 200 were unable to switch between low and high power modes described herein.

Figure 3:
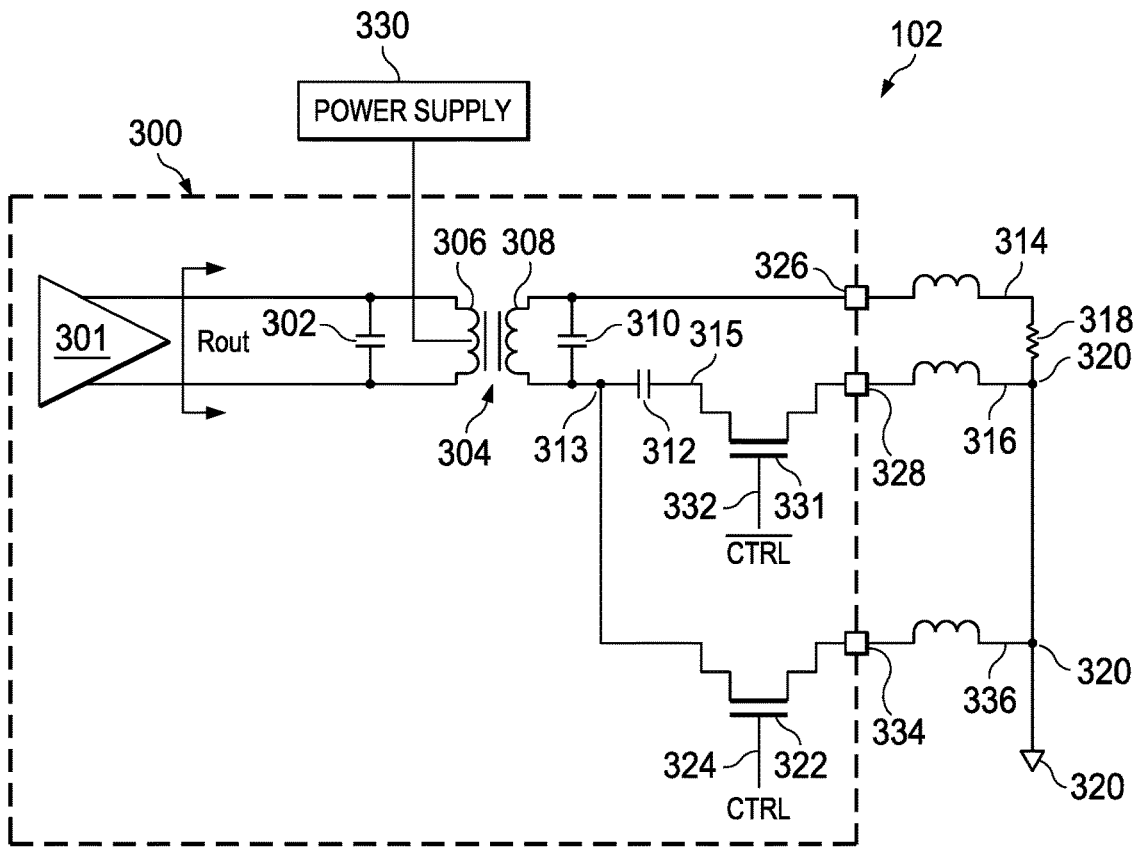
FIG. 3 is a circuit diagram of an electronic device having dynamically configurable power levels, in accordance with various examples.

FIG. 3 is a circuit diagram of the electronic device 102, in accordance with various examples, and FIG. 3 is now described with reference to FIG. 2. The electronic device 102 may include an example transmitter 300. The example transmitter 300 is representative of the transmitter 134 shown in FIGS. 1B and 1C. The example transmitter 300 includes a PA 301, which is similar to the PA 201. The transmitter 300 may include a capacitor 302, which is similar to the capacitor 202. The transmitter 300 may include a transformer 304 having a transformer coil 306 and a transformer coil 308 electromagnetically coupled to the transformer coil 306. The transformer 304 is analogous to the transformer 204; the transformer coil 306 is analogous to the transformer coil 206; and the transformer coil 308 is analogous to the transformer coil 208. A power supply 330, which is similar to the power supply 230, is coupled to the transformer coil 306. The transmitter 300 may include a capacitor 310, which is analogous to the capacitor 210. A bond wire 314 couples to a bond pad 326 and to a load 318, which is representative of the antenna 128 (FIG. 1A).

A capacitor 312 is coupled to a node 313 and to a switch 331 (e.g., an n-type or p-type MOSFET). The switch 331 is driven by a signal $\overline{CTRL}$, which is the inverse of the signal CTRL. For example, $\overline{CTRL}$ may be generated by the controller 130 (FIG. 1C) and provided at control line 332. The switch 331 is coupled to bond pad 328, which is coupled to bond wire 316. Bond wire 316 is coupled to ground 320, and ground 320 is coupled to load 318.

The capacitor 312, the switch 331, and the bond wire 316 collectively form a first leg of the transmitter 300. A second leg of the transmitter 300 is in parallel with the first leg and includes a switch 322 (e.g., an n-type or p-type MOSFET) having a control line 324 driven by CTRL, and a bond wire 336 coupled to the switch 322 by way of bond pad 334. CTRL, like $\overline{CTRL}$, is generated by the controller 130, although in some examples, the controller 130 may generate one of these control signals and the other control signal may be generated by an inverter. The bond wire 336 is coupled to ground 320, as shown. Together, the capacitor 312 and the switches 322 and 331 form an example SCN 140 (FIG. 1C).

Because the controller 130 controls the switch 322 with CTRL and controls the switch 331 with $\overline{CTRL}$, the switches 322, 331 are on at mutually exclusive times. Stated another way, the switch 322 is off if and only if the switch 331 is on, and the switch 322 is on if and only if the switch 331 is off. When the controller 130 drives CTRL high, the switch 322 is on and the switch 331 is off, placing the transmitter 300 in a low power mode. The voltage swings that occur at nodes 313 and 315 are insufficient to turn on the switch 331, and thus switch 331 remains off in this mode. Consequently, the first leg becomes an open circuit, and the second leg is a closed circuit. Thus, the parasitic inductances in the transmitter 300 are provided by the bond wires 314 and 336. The various components of the electronic device 102, including the bond wires 314 and 336, the impedance of the load 318, and the turns ratio of the transformer 304, may be selected to produce a specific target Psat value for the low power mode, such as approximately 22.2 dBm. Example values of such components to produce a Psat of approximately 22.2 dBm include a parasitic inductance of 1.2 nH for the bond wire 314, a parasitic inductance of 0.6 nH for the bond wire 336, an impedance of 50 ohms for the load 318, a turns ratio of 1:1 for the transformer 304. Expressions (1) and (2) above apply to the structure of FIG. 3, and, for brevity, they are not explained again here.

When the controller 130 drives CTRL low, the switch 322 is off and the switch 331 is on, placing the transmitter 300 in a high power mode. The voltage swing that occurs at node 313 is insufficient to turn on the switch 322 since the overall impedance of the bond wire 316 is reduced by the capacitor 312, and thus switch 322 remains off in this mode. Consequently, the first leg becomes a closed circuit, and the second leg is an open circuit. Closing the switch 331 engages the capacitor 312 with the bond wire 316. As a result, the capacitor 312 attenuates the parasitic inductance of the bond wire 316 by expression (3) above. This parasitic inductance having been attenuated, expressions (1) and (2) are then useful to determine the Psat and Rout values achieved in the high power mode. An example Psat value in the high power mode is 23 dBm. Example values of components useful to produce a Psat of 23 dBm include a parasitic inductance of 1.2 nH for the bond wire 314, a parasitic inductance of 0.6 nH for the bond wire 316, an impedance of 50 ohms for the load 318, a turns ratio of 1:1 for the transformer 304, and a capacitance of 4-6 pF (e.g., 5 pF) for the capacitor 312. By providing two different power modes that achieve two different Psat values, the BO may be reduced as described above. Further, the engagement of the capacitor 312 in the high power mode mitigates the undesirable transformer losses described above.

FIG. 4 is a graph 400 depicting transmitter impedance Rout as a function of signal frequency, in accordance with various examples. The x-axis indicates frequency in gigahertz (GHz), and the y-axis indicates Rout in ohms. Curve 402 indicates, for a transmitter in accordance with examples described herein, Rout as a function of frequency in the low power mode. Curve 404 indicates, for a transmitter in accordance with examples described herein, Rout as a function of frequency in the high power mode. As shown, for the majority of the indicated frequency sweep, the low power mode (curve 402) produces a higher impedance than the high power mode (curve 404), and the higher impedance results in a lower Psat. This relationship is true at least in the 802.11 b/g band, as numeral 406 indicates.

FIG. 5 is a graph 500 depicting transmitter output power as a function of transmitter input power, in accordance with various examples. The graph 500 includes an x-axis indicating input signal amplitude Vin (in dB) and a y-axis indicating power out of the transmitter (e.g., transmitter 200, 300) (Pout). Curve 502 indicates efficiency of the transmitter (or, more specifically, of the PA in the transmitter) in the low power mode, and curve 504 indicates efficiency of the transmitter in the high power mode. At example Vin values 506 and 508, the efficiency of the low power mode is greater than the efficiency of the high power mode, as the low power mode produces a higher Pout given the same Vin. Similarly, to produce a common Pout value of 15 dBm indicated by numeral 510, a lower Vin is needed for the low power mode than is needed for the high power mode. Numeral 512 indicates an example difference of 0.8 dBm between the Pout values of the low and high power modes.

FIG. 6 is a graph 600 depicting transmitter power amplifier efficiency as a function of transmitter input power, in accordance with various examples. The x-axis indicates Vin, and the y-axis indicates PA efficiency. Curve 602 indicates PA efficiency in the low power mode, and curve 604 indicates PA efficiency in the high power mode. As explained above, the Vin values indicated by numerals 506, 508 produce a Pout of 15 dBm. Thus, the Vin values indicated by numerals 606, 608 also produce a Pout of 15 dBm, since numerals 606, 608 correspond to numerals 506, 508, respectively. Stated another way, the Vin value indicated by numerals 506, 606 cause 15 dBm to be produced in the low power mode, and the Vin value indicated by numerals 508, 608 cause 15 dBm to be produced in the high power mode. Accordingly, as numeral 610 indicates, the low power mode corresponds to an efficiency of 24.6% when 15 dBm is being produced, and the high power mode corresponds to an efficiency of 22.5% when 15 dBm is being produced. The voltage gain of the power amplifier (e.g., power amplifier 201, 301) is also increased, as an output of 15 dBm is produced at a lower Vin.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Unless otherwise stated, "about," "approximately," or "substantially" preceding a value means +/−10 percent of the stated value. Modifications are possible in the described examples, and other examples are possible within the scope of the claims.

What is claimed is:

1. A device, comprising:
   a transmitter, comprising:
      a power amplifier;
      a first transformer coil coupled to the power amplifier;
      a second transformer coil adapted to be electromagnetically coupled to the first transformer coil;
      a first bond wire coupled to a first end of the second transformer coil and adapted to be coupled to a first end of an antenna;
      a capacitor coupled to a second end of the second transformer coil;
      a switch coupled to the capacitor and configured to engage and disengage the capacitor from the transmitter; and
      a second bond wire coupled to the switch and adapted to be coupled to a second end of the antenna.

2. The device of claim 1, wherein the capacitor has a capacitance ranging from 4 pico Farads to 6 pico Farads.

3. The device of claim 1, wherein the first and second transformer coils are physically structured such that the transmitter has a saturated power output of approximately 22.2 dBm.

4. The device of claim 1, wherein, responsive to the switch being closed, the capacitor is configured to be disengaged from the transmitter and the transmitter is configured to operate in a first power mode.

5. The device of claim 4, wherein, responsive to the switch being opened, the capacitor is configured to be engaged in the transmitter and the transmitter is configured to operate in a second power mode, a saturated power output Psat of the transmitter being greater in the second power mode than in the first power mode.

6. The device of claim 1, wherein the switch is coupled in parallel with the capacitor.

7. The device of claim 1, wherein the switch is coupled in series with the capacitor and in series with the second bond wire.

8. The device of claim 7, further comprising a second switch and a third bond wire, a combination of the second switch and the third bond wire coupled in parallel with a combination of the capacitor, the switch, and the second bond wire.

9. A device, comprising:
a transmitter, comprising:
a power amplifier;
a first transformer coil coupled to the power amplifier;
a second transformer coil adapted to be electromagnetically coupled to the first transformer coil;
a first bond wire coupled to a first end of the second transformer coil and adapted to be coupled to a first end of an antenna;
a first leg including a capacitor coupled to a second end of the second transformer coil, a first switch coupled in series with the capacitor, and a second bond wire coupled in series to the first switch, the second bond wire adapted to be coupled to a second end of the antenna; and
a second leg coupled in parallel with the first leg, the second leg including a second switch coupled to the second end of the second transformer coil and to the capacitor and a third bond wire coupled in series to the second switch, the third bond wire adapted to be coupled to the second end of the antenna.

10. The device of claim 9, wherein the capacitor has a capacitance of approximately 5 pico Farads.

11. The device of claim 9, wherein the capacitor has a capacitance of approximately 4-6 pico Farads.

12. The device of claim 9, further comprising a controller configured to close the first switch and open the second switch in a first power mode, and wherein, in the first power mode, the transmitter is configured to transmit signals at a first maximum power level that is based on a capacitance of the capacitor.

13. The device of claim 12, wherein the controller is configured to open the first switch and close the second switch to enact a second power mode in which the transmitter is configured to transmit signals at a second maximum power level that is less than the first maximum power level.

14. The device of claim 9, wherein the first and second legs are coupled at a node, and wherein, responsive to closure of the first switch, the transmitter is configured to generate a voltage swing at the node that is insufficient to turn on the second switch.

15. The device of claim 9, wherein the first and second legs are coupled at a node, and wherein, responsive to closure of the second switch, the transmitter is configured to generate a voltage swing at the node that is insufficient to turn on the first switch.

16. A device, comprising:
a transmitter, including:
a power amplifier;
a first transformer coil coupled to the power amplifier;
a second transformer coil adapted to be electromagnetically coupled to the first transformer coil;
a capacitor coupled to the second transformer coil;
a first transistor coupled in series with the capacitor;
a first bond wire coupled to the first transistor;
a second transistor coupled to the second transformer coil and the capacitor; and
a second bond wire coupled to the second transistor; and
a controller coupled to the transmitter, the controller configured to:
turn on the first transistor and turn off the second transistor to enact a first power mode in which the capacitor is engaged with the second bond wire, and wherein, in the first power mode, the transmitter is configured to transmit signals at a first maximum power level that is based on a capacitance of the capacitor; and
turn off the first transistor and turn on the second transistor to enact a second power mode in which the capacitor is disengaged from the second bond wire, and wherein, in the second power mode, the transmitter is configured to transmit signals at a second maximum power level that is less than the first maximum power level.

17. The device of claim 16, wherein, in the first power mode, the transmitter is configured to generate a voltage swing at a node coupled to the capacitor and the second transistor, the voltage swing insufficient to turn on the second transistor.

18. The device of claim 16, wherein, in the second power mode, the transmitter is configured to generate a voltage swing at a node coupled to the capacitor and the second transistor, the voltage swing insufficient to turn on the first transistor.

19. The device of claim 16, wherein the first and second transformer coils are physically structured such that the transmitter has a saturated power output of approximately 22.2 dBm.

20. The device of claim 16, wherein the capacitor has a capacitance of approximately 4-6 pico Farads.

21. The device of claim 16, wherein the capacitor has a capacitance of approximately 5 pico Farads.

* * * * *